(12) United States Patent
Chen et al.

(10) Patent No.: US 11,875,970 B2
(45) Date of Patent: Jan. 16, 2024

(54) RADIO FREQUENCY ELECTRODE ASSEMBLY FOR PLASMA PROCESSING APPARATUS, AND PLASMA PROCESSING APPARATUS

(71) Applicant: Advanced Micro-Fabrication Equipment Inc. China, Shanghai (CN)

(72) Inventors: Longbao Chen, Shanghai (CN); Jie Liang, Shanghai (CN); Weina Wang, Shanghai (CN); Leyi Tu, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 523 days.

(21) Appl. No.: 16/718,056

(22) Filed: Dec. 17, 2019

(65) Prior Publication Data
US 2020/0194231 A1 Jun. 18, 2020

(30) Foreign Application Priority Data

Dec. 17, 2018 (CN) .......................... 201811543565.9
Jul. 4, 2019 (CN) .......................... 201910600861.6

(51) Int. Cl.
H01J 37/32 (2006.01)
H01L 21/683 (2006.01)
H05H 1/46 (2006.01)

(52) U.S. Cl.
CPC .. *H01J 37/32091* (2013.01); *H01J 37/32165* (2013.01); *H01L 21/6831* (2013.01); *H05H 1/46* (2013.01)

(58) Field of Classification Search
None
See application file for complete search history.

(56) References Cited

U.S. PATENT DOCUMENTS 6,156,151 A * 12/2000 Komino .............. H01J 37/3244
118/723 R
6,664,738 B2 * 12/2003 Arai .................. H01J 37/32724
315/111.21
(Continued)

FOREIGN PATENT DOCUMENTS

CN 102804931 A 11/2012
CN 108242382 A 7/2018
(Continued)

*Primary Examiner* — Sylvia Macarthur
(74) *Attorney, Agent, or Firm* — Womble Bond Dickinson (US) LLP

(57) ABSTRACT

Disclosed are a radio frequency electrode assembly for a plasma processing apparatus, and a plasma processing apparatus, wherein the radio frequency electrode assembly for a plasma processing apparatus comprises: a base in which a first fluid passage is provided, the first fluid passage being configured for connecting to a first fluid source; an electrostatic chuck disposed on the base; a focus ring disposed peripheral to the electrostatic chuck; a heat conducting ring disposed around the base, the heat conducting ring enclosing at least part of the base, the heat conducting ring being disposed below the focus ring, a second fluid passage being provided in the heat conducting ring, the second fluid passage being connected to a second fluid source, heat conduction being enabled between the heat conducting ring and the focus ring. The plasma processing apparatus can adjust polymers distribution in the edge area of the to-be-processed substrate.

18 Claims, 4 Drawing Sheets

(56) References Cited

U.S. PATENT DOCUMENTS

| | | | |
|---|---|---|---|
| 6,767,844 B2 | 7/2004 | Huang | |
| 7,678,225 B2* | 3/2010 | Nezu | H01J 37/32623 118/723 VE |
| 7,882,800 B2* | 2/2011 | Koshiishi | H01J 37/32642 156/915 |
| 8,404,572 B2* | 3/2013 | Chang | H01L 21/67253 165/80.4 |
| 8,449,679 B2 | 5/2013 | Dhindsa | |
| 8,522,715 B2* | 9/2013 | Fischer | H01J 37/32642 156/915 |
| 8,696,862 B2* | 4/2014 | Sasaki | H01L 21/6831 118/724 |
| 10,283,382 B2 | 5/2019 | Noh et al. | |
| 10,593,520 B2 | 3/2020 | Wu et al. | |
| 10,622,196 B2 | 4/2020 | Nagayama et al. | |
| 11,062,885 B2 | 7/2021 | Sim et al. | |
| 2004/0083975 A1* | 5/2004 | Tong | H01J 37/32623 118/728 |
| 2004/0163601 A1* | 8/2004 | Kadotani | H01L 21/6875 118/728 |
| 2004/0187787 A1* | 9/2004 | Dawson | H01L 21/67248 118/728 |
| 2004/0261946 A1 | 12/2004 | Endoh et al. | |
| 2005/0279457 A1* | 12/2005 | Matsudo | H01L 21/67069 156/345.47 |
| 2006/0118243 A1 | 6/2006 | Choi | |
| 2008/0236749 A1* | 10/2008 | Koshimizu | H01J 37/32348 156/345.33 |
| 2010/0218785 A1* | 9/2010 | Green | H01J 37/32642 134/1.1 |
| 2012/0118505 A1 | 5/2012 | Ishibashi | |
| 2014/0130743 A1* | 5/2014 | Toriya | C23C 16/45574 118/725 |
| 2015/0053348 A1* | 2/2015 | Nagayama | H01J 37/3266 118/723 R |
| 2015/0255255 A1* | 9/2015 | Ohata | H01L 21/68735 156/345.28 |
| 2018/0155823 A1* | 6/2018 | Matsumoto | C23C 16/042 |
| 2018/0190501 A1* | 7/2018 | Ueda | H01L 21/67069 |
| 2018/0330925 A1* | 11/2018 | Sim | H01J 37/32724 |
| 2018/0358211 A1* | 12/2018 | Mun | H01L 21/6831 |
| 2020/0194231 A1* | 6/2020 | Chen | H01L 21/67109 |

FOREIGN PATENT DOCUMENTS

| | | |
|---|---|---|
| CN | 108878247 A * | 11/2018 |
| JP | 2011192661 A | 9/2011 |
| KR | 20110045005 A | 5/2011 |
| KR | 20170076572 A | 7/2017 |
| KR | 20180074013 A | 7/2018 |
| KR | 20180097475 A | 8/2018 |
| KR | 101927936 B1 | 12/2018 |
| TW | I250550 B | 3/2006 |
| TW | I445124 B | 7/2014 |
| TW | 201724159 A | 7/2017 |
| TW | I636153 B | 9/2018 |

* cited by examiner

RADIO FREQUENCY ELECTRODE ASSEMBLY FOR PLASMA PROCESSING APPARATUS, AND PLASMA PROCESSING APPARATUS

RELATED APPLICATION

This application claims priority benefit from Chinese Patent Applications No. 201811543565.9 filed Dec. 17, 2018 and 201910600861.6 filed Jul. 4, 2019 the disclosure of which is hereby incorporated herein by reference in its entirety.

FIELD

The present disclosure relates to semiconductor equipment, and more particularly relates to a radio frequency electrode assembly for a plasma processing apparatus, and a plasma processing apparatus.

BACKGROUND

In the technical field of semiconductor fabrication, it is often needed to perform plasma processing to a to-be-processed substrate. The process of plasma processing needs to be undergone in a plasma processing apparatus.

The plasma processing apparatus comprises a vacuum chamber, a support stage for supporting the to-be-processed substrate being provided in the vacuum chamber, the support stage generally including a base, and an electrostatic chuck, which is disposed above the base, for fixing the substrate.

However, it is difficult for conventional plasma processing apparatuses to adjust polymer distribution in the edge area of the to-be-processed substrate.

SUMMARY

In view of the above, the present disclosure provides a radio frequency electrode assembly for a plasma processing apparatus, and a plasma processing apparatus capable of adjusting polymer distribution in the edge area of a to-be-processed substrate.

To solve the above technical problem, the present disclosure provides a radio frequency electrode assembly for a plasma processing apparatus, comprising: a base in which a first fluid passage is provided, the first fluid passage being configured for connecting to a first fluid source; an electrostatic chuck disposed on the base, a to-be-processed substrate being disposed on the electrostatic chuck; a focus ring disposed peripheral to the electrostatic chuck; and a heat conducting ring disposed around the base, the heat conducting ring being disposed below the focus ring, the heat conducting ring enclosing at least part of the base, a second fluid passage being provided in the heat conducting ring, the second fluid passage being connected to a second fluid source, heat conduction being enabled between the heat conducting ring and the focus ring.

Optionally, a gap is provided between the heat conducting ring and the base.

Optionally, the gap has a width greater than or equal to 0.5 mm.

Optionally, a thermal insulation material layer is filled in the gap, a material of the thermal insulation material layer being selected from Teflon, polyetherimide, polyether-ether-ketone, or polyimide.

Optionally, the radio frequency electrode assembly further comprises: a coupling ring disposed between the focus ring and the heat conducting ring; a heat conductive structure disposed between the coupling ring and the heat conducting ring; a bottom grounding ring enclosing the heat conducting ring; a dielectric ring disposed between the bottom grounding ring and the heat conducting ring, the dielectric ring surrounding the heat conducting ring.

Optionally, a material of the coupling ring is selected from aluminum oxide or quartz.

Optionally, the radio frequency electrode assembly further comprises: a flat bottom plate disposed below the base.

Optionally, the flat bottom plate and the heat conducting ring are interconnected; or, the flat bottom plate and the heat conducting ring are discretely provided.

Optionally, the second fluid passage includes N areas sequentially along the perimeter of the focus ring, where N is a natural number greater than or equal to 1; a first area of the second fluid passage being connected to a fluid inlet, the $N^{th}$ area of the second fluid passage being connected to a fluid outlet, the second fluid source entering the second fluid passage via the fluid inlet and flowing out of the second fluid passage from the fluid outlet; and the electrostatic chuck includes a first supporting face, the first supporting face being configured for supporting the to-be-processed substrate.

Optionally, in the direction vertical to the first supporting face, respective areas of the second fluid passage have an equal size; and the distances from the tops of respective areas of the second fluid passage to the bottom of the focus ring are equal.

Optionally, in the direction vertical to the first supporting face, respective areas of the second fluid passage have an equal size; and the distances from the tops of the first till the $N^{th}$ areas of the second fluid passage to the bottom of the focus ring sequentially decrease.

Optionally, in the direction vertical to the first supporting face, the sizes of respective areas of the second fluid passage are equal; the distances from the tops of the first till the N-$1^{th}$ areas of the second fluid passage to the bottom of the focus ring sequentially decrease; and the distance from the top of the $N^{th}$ area of the second fluid passage to the bottom of the focus ring is greater than the distance from the top of the N-$1^{th}$ area of the second fluid passage to the bottom of the focus ring.

Optionally, in the direction vertical to the first supporting face, the sizes of the first till the $N^{th}$ areas of the second fluid passage sequentially increase; the distances from bottoms of the first till the $N^{th}$ areas of the second fluid passage to the bottom of the focus ring are identical; and the distances from the tops of the first till the Nth areas of the second fluid passage to the bottom of the focus ring sequentially decrease.

Optionally, in the direction vertical to the first supporting face, the sizes of the first till the N-$1^{th}$ areas of the second fluid passage sequentially increase, the size of the $N^{th}$ area of the second fluid passage being smaller than the size of the N-$1^{th}$ area of the second fluid passage; the distances from the bottoms of the first till the $N^{th}$ areas of the second fluid passage to the bottom of the focus ring are equal; and the distances from the tops of the first till the N-$1^{th}$ areas of the second fluid passage sequentially decrease, wherein the distance from the top of the $N^{th}$ area of the second fluid passage is greater than the distance from the top of the N-$1^{th}$ area of the second fluid passage to the bottom of the focus ring.

Optionally, the tops of the first till the N-1th areas of the second fluid passage rise in a smooth arc or rises stepwise.

Optionally, the second fluid passage runs 1 lap or more than 1 lap.

Optionally, the radio frequency electrode assembly further comprises: a measuring unit configured for measuring a size of a trench, in the direction parallel to the surface of the to-be-processed substrate, formed by an edge area of the to-be-processed substrate; wherein when the size of the trench in the direction parallel to the surface of the to-be-processed substrate is measured to be greater than a target size, the temperature of the second fluid source is raised; when the size of the trench in the direction parallel to the surface of the to-be-processed substrate is measured to be lower than the target size, the temperature of the second fluid source is lowered.

Correspondingly, the present disclosure further provides a plasma processing apparatus, comprising: a vacuum chamber; a base disposed downstream of the vacuum chamber, a first fluid trench being provided inside the base, the first fluid passage being configured for connecting to a first fluid source; an electrostatic chuck disposed on the base, a to-be-processed substrate being disposed on the electrostatic chuck; a focus ring disposed peripheral to the electrostatic chuck; a heat conducting ring disposed around the base, the heat conducting ring being disposed below the focus ring, the heat conducting ring enclosing at least part of the base, a second fluid passage being provided in the heat conducting ring, the second fluid passage being connected to a second fluid source, heat conduction being enabled between the heat conducting ring and the focus ring; and gas intake means disposed at the top of the vacuum chamber, the gas intake means being configured for supplying a reactant gas into the vacuum chamber.

Optionally, the second fluid passage includes N areas sequentially along the perimeter of the focus ring, N being a natural number greater than or equal to 1; a first area of the second fluid passage being connected to a fluid inlet, the $N^{th}$ area of the second fluid passage being connected to a fluid outlet, the second fluid source entering the second fluid passage via the fluid inlet and flowing out of the second fluid passage from the fluid outlet; and the electrostatic chuck includes a first supporting face, the first supporting face being configured for supporting the to-be-processed substrate.

Optionally, in the direction vertical to the first supporting face, respective areas of the second fluid passage have an equal size; and the distances from the tops of respective areas of the second fluid passage to the bottom of the focus ring are equal.

Optionally, in the direction vertical to the first supporting face, respective areas of the second fluid passage have an equal size; the distances from the tops of the first till the $N^{th}$ areas of the second fluid passage to the bottom of the focus ring sequentially decrease.

Optionally, in the direction vertical to the first supporting face, the sizes of respective areas of the second fluid passage are equal; the distances from the tops of the first till the N-$1^{th}$ areas of the second fluid passage to the bottom of the focus ring sequentially decrease; and the distance from the top of the $N^{th}$ area of the second fluid passage to the bottom of the focus ring is greater than the distance from the top of the N-$1^{th}$ area of the second fluid passage to the bottom of the focus ring.

Optionally, in the direction vertical to the first supporting face, the sizes of the first till the $N^{th}$ areas of the second fluid passage sequentially increase; the distances from the bottoms of the first till the Nth areas of the second fluid passage to the bottom of the focus ring are equal; the distances from the tops of the first till the $N^{th}$ areas of the second fluid passage to the bottom of the focus ring decrease sequentially.

Optionally, in the direction vertical to the first supporting face, the sizes of the first till the N-$1^{th}$ areas of the second fluid passage sequentially increase, the size of the $N^{th}$ area of the second fluid passage being smaller than the size of the N-$1^{th}$ area of the second fluid passage; the distances from the bottoms of the first till the $N^{th}$ areas of the second fluid passage to the bottom of the focus ring are equal; and the distances from the tops of the first till the N-$1^{th}$ areas of the second fluid passage sequentially decrease, wherein the distance from the top of the $N^{th}$ area of the second fluid passage is greater than the distance from the top of the N-$1^{th}$ area of the second fluid passage to the bottom of the focus ring.

Optionally, the tops of the first till the N-$1^{th}$ areas of the second fluid passage rise in a smooth arc or rise stepwise.

Optionally, the second fluid passage runs 1 lap or more than 1 lap.

Optionally, the plasma processing apparatus further comprises: a flat bottom plate disposed below the base.

Optionally, the flat bottom plate and the heat conducting ring are interconnected; or, the flat bottom plate and the heat conducting ring are discretely provided.

Optionally, the gas intake means comprises a mount base plate disposed below a dielectric window of the vacuum chamber and a gas showerhead disposed below the mount base plate; the plasma processing apparatus further comprises: a radio frequency power source, the radio frequency power source being connected to the base; and a bias power source, the bias power source being connected to the base.

Optionally, a side wall of the vacuum chamber includes a second supporting face; the plasma processing apparatus further comprises: an annular inner lining, the annular inner lining including a side wall guard ring, and a support ring which fixes the side wall guard ring onto the second supporting face; a dielectric window disposed on the vacuum chamber; an inductive coupling coil disposed on the dielectric window; a radio frequency power source connected to the inductive coupling coil; and a bias power source connected to the base.

Optionally, the plasma processing apparatus further comprises: sealing grooves disposed in the upper and lower surfaces of the heat conducting ring and sealing washers disposed in the sealing grooves, such that the base and the electrostatic chuck are both in a vacuum environment.

Optionally, the plasma processing apparatus further comprises: a measuring unit configured for measuring a size of a trench, in the direction parallel to the surface of the to-be-processed substrate, formed by an edge area of the to-be-processed substrate; wherein when the size of the trench in the direction parallel to the surface of the to-be-processed substrate is measured to be greater than a target size, the temperature of the second fluid source is raised; when the size of the trench in the direction parallel to the surface of the to-be-processed substrate is measured to be lower than the target size, the temperature of the second fluid source is lowered.

Compared with the prior art, the present disclosure offers the following beneficial effects:

In the radio frequency electrode assembly for a plasma processing apparatus as disclosed, the base is surrounded by a heat conducting ring, a second fluid passage being provided in the heat conducting ring; the second fluid passage being connected to the second fluid source; as such, the temperature of the heat conducting ring may be adjusted by adjusting the temperature of the second fluid source. Because heat conduction is enabled between the heat conducting ring and the focus ring, temperature control of the focus ring is achieved by adjusting the temperature of the second fluid source, achieving adjustability of the temperature difference between the focus ring and the edge of the to-be-processed substrate, which further enables adjustment of the polymer distribution at the edge of the to-be-processed substrate, facilitating forming a trench which meets process requirements in the edge area of the to-be-processed substrate.

A measuring unit is further provided, which is configured for measuring a size of a trench, in the direction parallel to the surface of the to-be-processed substrate, formed by an edge area of the to-be-processed substrate; wherein when the size of the trench in the direction parallel to the surface of the to-be-processed substrate is measured to be greater than a target size, the temperature of the second fluid source is raised; and when the size of the trench in the direction parallel to the surface of the to-be-processed substrate is measured to be lower than the target size, the temperature of the second fluid source is lowered. This facilitates agreement between the size of the trench, in the direction parallel to the surface of the to-be-processed substrate, formed in the edge area of the to-be-processed substrate, and the target size.

Further, the second fluid passage includes N areas sequentially along the perimeter of the focus ring, where N is a natural number greater than or equal to 1, a first area of the second fluid passage being connected to a fluid inlet, the $N^{th}$ area of the second fluid passage being connected to the fluid outlet, the second fluid source entering the second fluid passage via the fluid inlet and flowing out of the second fluid passage from the fluid outlet. As it takes certain time for the second fluid source to flow through the second fluid passage, a temperature difference exists between the fluid inlet and the fluid outlet of the second fluid source. To narrow down the differences between temperature control capacities of the second fluid source in different areas of the second fluid passage, it is configured that the distances from the tops of the first till the N-$1^{th}$ areas of the second fluid passage to the bottom of the focus ring sequentially decrease, the distance from the top of the $N^{th}$ area of the second fluid passage to the bottom of the focus ring being greater than the distance from the top of the N-$1^{th}$ area of the second fluid passage to the bottom of the focus ring, thereby facilitating improvement of the uniformity of the temperatures in different areas of the focus ring.

DETAILED DESCRIPTION OF EMBODIMENTS

To solve the issue that it is difficult for conventional plasma processing apparatuses to adjust polymer distribution in the edge area of a to-be-processed substrate, the present disclosure provides a radio frequency electrode assembly for a plasma processing apparatus, and a plasma processing apparatus, wherein the radio frequency electrode assembly for a plasma processing apparatus comprises: a base in which a first fluid passage is provided, the first fluid passage being configured for connecting to a first fluid source; an electrostatic chuck disposed on the base, a focus ring disposed peripheral to the electrostatic chuck; and a heat conducting ring disposed around the base, the heat conducting ring enclosing part of the base, the heat conducting ring being disposed below the focus ring, a second fluid passage being provided in the heat conducting ring, the second fluid passage being connected to a second fluid source, heat conduction being enabled between the heat conducting ring and the focus ring. The plasma processing apparatus can adjust polymer distribution in the edge area of the to-be-processed substrate.

To make the technical problem, the technical solution, and the technical effect of the present disclosure more clearly and comprehensively, the present disclosure will be described in detail through preferred embodiments in conjunction with the accompanying drawings.

Figure 1:
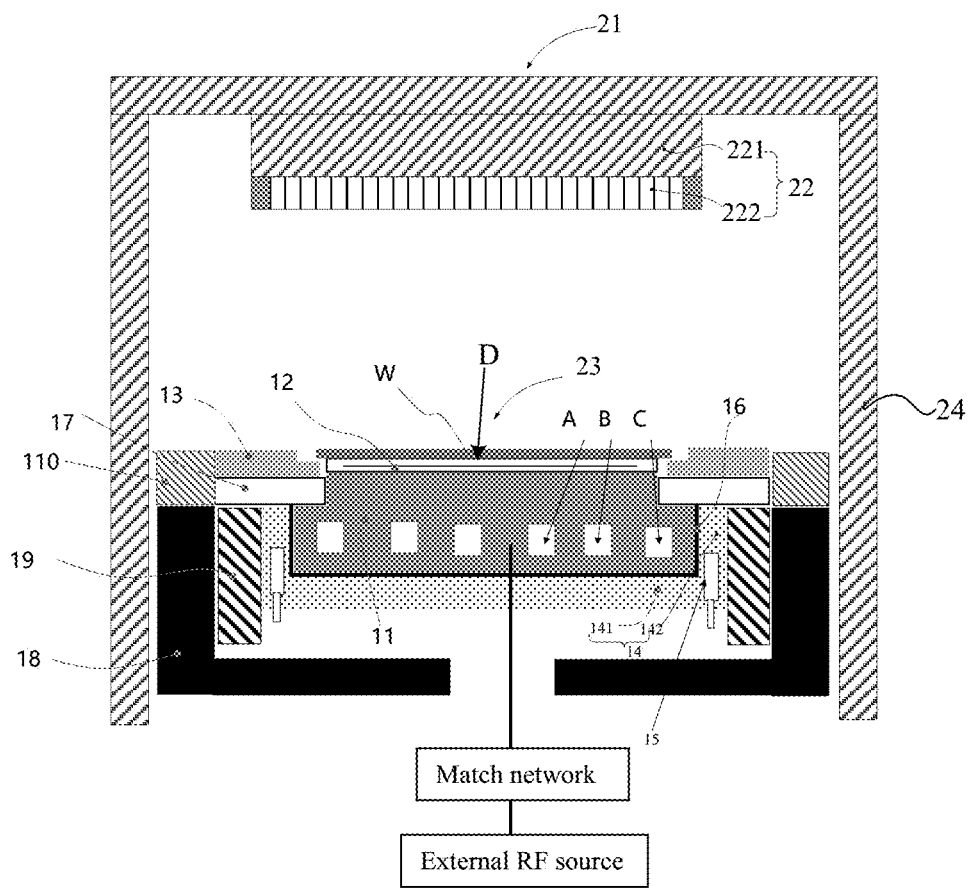
FIG. 1 is a structural schematic diagram of a plasma processing apparatus including a radio frequency electrode assembly according to an embodiment of the present disclosure.

FIG. 1 is a structural schematic diagram of a plasma processing apparatus including a radio frequency electrode assembly according to an embodiment of the present disclosure.

As shown in FIG. 1, a plasma processing apparatus 21 comprises: a vacuum chamber 24; a base 11 disposed at the bottom of the vacuum chamber 24, first fluid passages A, B, and C being provided in the base 11, the first fluid passages A, B, and C being connected to a first fluid source (not shown), the base 11 being disposed in the vacuum chamber 24; an electrostatic chuck 12 disposed on the substrate 11, the electrostatic chuck 12 being configured for supporting a to-be-processed substrate W; a focus ring 13 disposed peripheral to the electrostatic chuck 12; a heat conducting ring 142 disposed around the base 11, the heat conducting ring 142 enclosing at least part of the base 11, the heat conducting ring 142 being disposed below the focus ring 13, inside the heat conducting ring 142 being provided a second fluid passage 15, the second fluid passage 15 being connected to a second fluid source (not shown), heat conduction being enabled between the heat conducting ring 142 and the focus ring 13; and gas intake means 22 disposed at the top of the vacuum chamber 24, the gas intake means 22 being configured for supplying a reactant gas into the vacuum chamber 24.

In this embodiment, the plasma processing apparatus 21 is a capacitively coupled plasma processing apparatus (CCP), wherein the gas intake means 22 comprises: a mount base plate 221 disposed at the top of the vacuum chamber 24, and a gas showerhead 222 disposed below the mount base plate 221. The gas showerhead 222 serves as an upper electrode, the base 11 serves as a lower electrode, and the radio frequency power source is connected to the upper electrode or the lower electrode. The radio frequency signal generated by the radio frequency power source converts the reactant gas to plasma via a capacitance formed between the upper electrode and the lower electrode. The bias power source is connected on the base 11, the base 11 is configured for supporting the to-be-processed substrate, which facilitates the plasma to move towards the surface of the to-be-processed substrate W to thereby process the to-be-processed substrate W.

In another embodiment, the plasma processing apparatus comprises: an inductively coupled plasma processing apparatus (ICP); the side wall of vacuum chamber includes a second supporting face; the inductively coupled plasma processing apparatus further comprises: an annular inner liner which includes a side wall shield ring, and a support ring which fixes the side wall shield ring onto the second supporting face; a dielectric window disposed on the vacuum chamber; an inductive coil disposed on the dielectric window; wherein the inductive coil is connected to a radio frequency power source, converting the reactant gas to be plasma, the base being connected to the bias power source, driving the ions move towards the surface of the substrate, which facilitations processing the to-be-processed substrate using the plasma.

The focus ring 13 is disposed peripheral to the electrostatic chuck 12, the focus ring 13 being capable of controlling the temperature, gas flow, and electric field distribution at the edge of the to-be-processed substrate W and further controlling the effect of processing the edge of the to-be-processed substrate W.

As an example, because the to-be-processed substrate W is generally a silicon substrate, a material of the focus ring 13 is selected from silicon or silicon carbide, which may reduce contamination from the focus ring 13 to the to-be-processed substrate W.

The electrostatic chuck 12 comprises a first supporting face D, the first supporting face D being configured for supporting the to-be-processed substrate; the electrostatic chuck 12 is disposed on the base 11, first fluid passages A, B, and C inside the base 11 being provided in the base 11, the first fluid passages A, B, and C being connected to the first fluid source; therefore, the temperature of the to-be-processed substrate may be adjusted by adjusting the temperature of the first fluid source. However, it is difficult to adjust the temperature in the edge area of the to-be-processed substrate using the first fluid source. A second fluid passage 15 is provided inside the heat conducting ring 142, the second fluid passage 15 being connected to a second fluid source. Temperature control of the heat conducting ring 142 may be achieved by adjusting the temperature of the second fluid source; because heat conduction is enabled between the heat conducting ring 142 and the focus ring 13, temperature control of the focus ring 13 may be realized by adjusting the temperature of the second fluid source; then the temperature difference between the focus ring 13 and the edge of the to-be-processed substrate W becomes adjustable, such that polymer distribution at the edge of the to-be-processed substrate W is adjustable, which facilitates forming a trench meeting process requirements in the edge area of the to-be-processed substrate W.

The plasma processing apparatus further comprises: a measuring unit configured for measuring the size (Critical dimension) of a trench in substrate edge area, the trenches are formed by plasma process. When the size of the trench in the direction parallel to the surface of the to-be-processed substrate W is measured to be greater than a target size, the temperature or flow rate of the second fluid source is raised; when the size of the trench in the direction parallel to the surface of the to-be-processed substrate W is measured to be lower than the target size, the temperature or flow rate of the second fluid source is lowered. This control method makes the size of the trench formed in the edge area of the to-be-processed substrate W approach the target size.

In this embodiment, the first fluid source is a first coolant, and the second fluid source is a second coolant.

In this embodiment, the second fluid passage 15 includes N areas sequentially along the perimeter, N being a natural number greater than or equal to 1, a first area of the second fluid passage 15 being connected to a fluid inlet, the $N^{th}$ area of the second fluid passage 15 being connected to a fluid outlet, the second fluid source entering the second fluid passage 15 via the fluid inlet and flowing out of the second fluid passage 15 from the fluid outlet.

In this embodiment, in the direction vertical to the first supporting face D, respective areas of the second fluid passage 15 have an equal cross section; and the distances from the tops of respective areas of the second fluid passage 15 to the bottom of the focus ring 13 are equal. A method of processing the second fluid passage comprises: providing a first plate;

forming a second fluid passage 15 inside the first plate, wherein in the direction vertical to the first supporting face D, respective areas of the second fluid passage 15 have an equal cross section; providing a second plate to be welded to the first plate, wherein the second plate seals all areas of the second fluid passage 15. Because the cross section of respective areas of the second fluid passage 15 in the direction vertical to the first supporting face D are equal and the distances from the tops of respective areas of the second fluid passage 15 to the bottom of the focus ring 13 are equal, respective areas of the second fluid passage 15 may be simultaneously formed, which facilitates lowering the complexity and difficulty of manufacturing the second fluid passage 15.

In this embodiment, a gap is provided between the heat conducting ring 142 and the base 11, such that the heat conducting ring 142 has little thermal impact on the base 11; because the base 11 is for supporting the to-be-processed substrate, it facilitates lowering the thermal impact on the central area of the to-be-processed substrate W.

In another embodiment, the heat conducting ring contacts with the base.

In such an embodiment, the gap has a width of greater than or equal to 0.5 mm, thereby reducing heat conductivity between the heat conducting ring 142 and the base 11.

In other embodiments, the gap has a width of less than 0.5 mm.

In this embodiment, a thermal insulation material layer 16 is filled in the gap; the thermal insulation material layer 16 has a relatively lower thermal conductivity, so as to isolate heat conductivity between the heat conducting ring 142 and the base 11, the thermal impact of the heat conducting ring 142 on the base 11 becomes even less, facilitating further reduction of the impact on the temperature of the central area of the to-be-processed substrate W.

A material of the thermal insulation material layer 16 is selected from Teflon or polyetherimide or polyether-ether-ketone or polyimide.

In this embodiment, the electrode assembly for the plasma processing apparatus further comprises: a flat bottom plate 141, edge of which are connected with the heat conducting ring 142; or, the flat bottom plate 141 and the heat conducting ring 142 are integrally formed. The flat bottom plate 141 and the heat conducting ring 142 form a facility plate 14. The gap between the flat bottom plate 141 and base 11 also filled with the thermal insulation material layer 16, such that the temperature of base and focus ring 13 could be regulated independently. Facility plate is always employed to seal the components above the facility plate in the vacuum space; in the present disclosure the sealing grooves could be disposed in the top surfaces of the heat conducting ring and elastic O ring disposed in the sealing grooves, such that the base and the electrostatic chuck are both in a vacuum environment.

In this embodiment, the electrode assembly for plasma processing apparatus further comprises: a coupling ring 17 disposed between the focus ring 13 and the heat conducting ring 142. The coupling ring 17 can facilitate heat conduction between the heat conducting ring 142 and the focus ring 13, such that the temperature of the focus ring 13 can be quickly regulated via the coupling ring 17. As an example, the coupling ring 17 is generally made of a dielectric material with a good heat conductivity. For example, the material of the coupling ring 17 may be selected from aluminum oxide or quartz.

In another embodiment, the coupling ring is not provided.

In such an embodiment, the plasma processing apparatus further comprises: a heat conducting device (for example a thin film thermal pad, not shown in FIG. 1) disposed between the coupling ring 17 and the heat conducting ring 142. With the heat conducting device, the thermal conductivity between the heat conducting ring 142 and the focus ring 13 is further enhanced.

in another embodiment, the heat conducting device is not provided.

In such an embodiment, the radio frequency electrode assembly for a plasma processing apparatus may further comprise: a bottom grounding ring 18, the bottom grounding ring 18 enclosing the heat conducting ring 142, the bottom grounding ring 18 being capable of leading the coupled radio frequency current in the vacuum chamber to the ground.

In this embodiment, the radio frequency electrode assembly for the plasma processing apparatus may further comprise: a dielectric ring 19 disposed between the grounding ring 18 and the heat conducting ring 142. Particularly, the heat conducting ring 142 is surrounded by the dielectric ring 19 and the bottom grounding ring 18. In this embodiment, the radio frequency electrode assembly for the plasma processing apparatus further comprises: an edge ring 110 disposed peripheral to the focus ring 13. The edge ring 110 is configured for adjusting the electromagnetic field distribution in the edge area of the vacuum chamber 24.

In another embodiment, the edge ring is not provided.

In such an embodiment, the plasma processing apparatus comprises a radio frequency electrode assembly, wherein the radio frequency electrode assembly comprises: a base 11 in which first fluid passages A, B, and C are provided, the first fluid passages A, B, and C being connected to a first fluid source; an electrostatic chuck 12 disposed on the base 11, the electrostatic chuck 12 being configured for supporting a to-be-processed substrate; a focus ring 13 disposed peripheral to the electrostatic chuck 12; and a heat conducting ring 142 disposed around the base 11, the heat conducting ring enclosing part of the base 11, the heat conducting ring being disposed below the focus ring 13; a second fluid passage 15 being provided in the heat conducting ring 13, the second fluid passage 15 being connected to a second fluid source, heat conduction being enabled between the heat conducting ring 142 and the focus ring 13.

Figure 2:
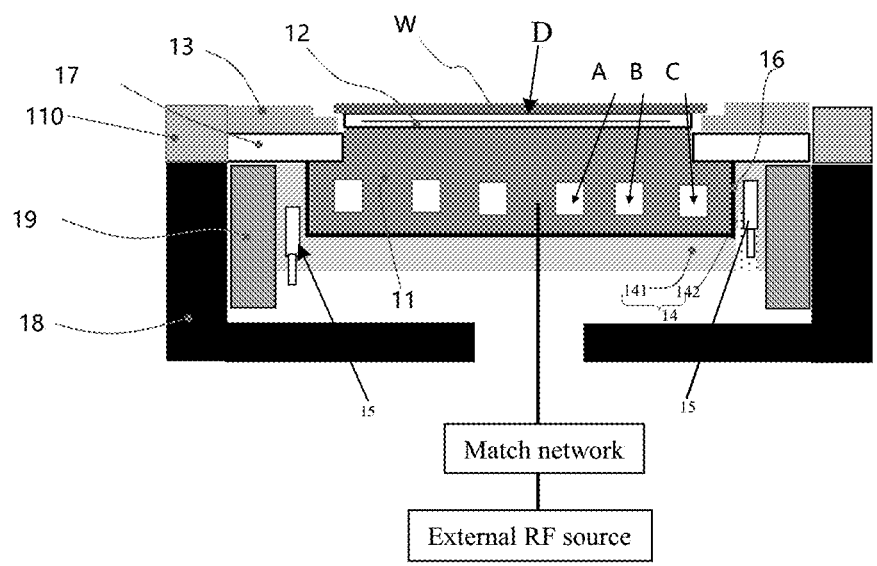
FIG. 2 is a structural schematic diagram of radio frequency electrode assembly for a plasma processing apparatus according to another embodiment of the present disclosure.

FIG. 2 shows a structural schematic diagram of a radio frequency electrode assembly for a plasma processing apparatus according to another embodiment of the present disclosure.

The radio frequency electrode assembly in this embodiment differs from the one described in the embodiment shown in FIG. 1 only in that the distances between the tops of the second fluid passage and focus ring 13 are changing along the passage. Specially ,the passage from area 1 to N-1 have a distance decrease sequentially, and have distance increases from area N-1 to area N. the significance for such a configuration lies in that: the first area of the second fluid passage 15 is connected to a fluid inlet, the $N^{th}$ area of the second fluid passage 15 is connected to the fluid outlet, the second fluid source flows into the second fluid passage 15 via the fluid inlet, and after flowing through each area of the second fluid passage 15, flows out of the fluid outlet. As it takes certain time for the second fluid source to flow through the second fluid passage 15, a temperature difference exists between the fluid inlet and the fluid outlet of the second fluid source. To narrow down the temperature differences of the second fluid in different areas of the second fluid passage 15, it is configured that the distances from the tops of the first till the N-1$^{th}$ areas of the second fluid passage 15 to the bottom of the focus ring 13 sequentially decrease. Therefore, the second fluid temperature difference are compensated with the distance difference in each area of the passage. However, because the fluid outlet is closer to the fluid inlet, the second fluid at the fluid inlet affects the temperature of the second fluid at the fluid outlet; in order to prevent a too large temperature difference between the second fluid at fluid inlet and at fluid inlet, it is configured that the distance from the top of the $N^{th}$ area of the second fluid passage 15 to the bottom of the focus ring 13 is greater than the distance from the top of the N-1$^{th}$ area of the second fluid passage 15 to the bottom of the focus ring 13, which facilitates improvement of the uniformity of the temperatures in different areas of the focus ring 13.

Additionally, although it is difficult to adjust the temperature in the edge area of the to-be-processed substrate W using the first fluid source, a second fluid passage 15 is provided in the heat conducting ring 142, wherein the second liquid source in the second fluid passage 15 can be used to adjust the temperature of the focus ring 13; then, the temperature difference between the focus ring 13 and the edge of the to-be-processed substrate W becomes adjustable; in this way, polymer distribution in the edge of the to-be-processed substrate W can be adjusted, which facilitates forming a trench meeting process requirements in the edge area of the to-be-processed substrate W.

In this embodiment, in the direction vertical to the first supporting face D, respective areas of the second fluid passage 15 have an equal cross section.

In other embodiments, in the direction vertical to the first supporting face, respective areas of the second fluid passage have an equal size; the distances from the tops of the first till the $N^{th}$ areas of the second fluid passage to the bottom of the focus ring sequentially decrease.

In this embodiment, the plasma processing apparatus comprises: a capacitively coupled plasma processing apparatus (CCP) or an inductively coupled plasma processing apparatus (ICP).

Figure 3:
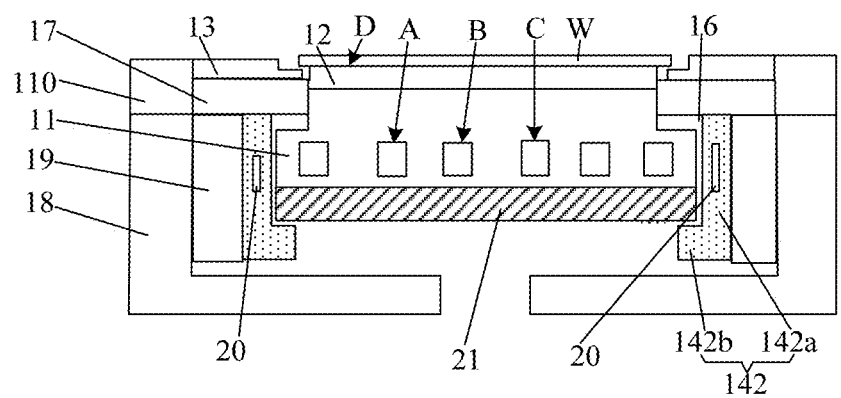
FIG. 3 is a structural schematic diagram of a radio frequency electrode assembly for a plasma processing apparatus according to a further embodiment of the present disclosure.

FIG. 3 is a structural schematic diagram of a radio frequency electrode assembly for a plasma processing apparatus according to a further embodiment of the present disclosure.

This embodiment differs from the one illustrated in FIG. 2 in that: in the direction vertical to the first supporting face D, the cross section of the first till the N-1$^{th}$ areas of the second fluid passage 20 sequentially increase, the cross section of the N$^{th}$ area of the second fluid passage 20 is smaller than the cross section of the N-1$^{th}$ area of the second fluid passage 20; the identical feature between this embodiment and the one illustrated in FIG. 2 is that: the distances from the tops of the first till the N$^{th}$ areas of the second fluid passage 20 to the bottom of the focus ring 13 sequentially decrease, the distance from the top of the N$^{th}$ area of the second fluid passage 20 is greater than the distance from the top of the N-1$^{th}$ area of the second fluid passage 20 to the bottom of the focus ring 13. The significance of configuring the distances from the tops of respective areas of the second liquid passage 20 to the bottom of the focus ring 13 is identical to the embodiment shown in FIG. 2, which is thus not detailed here.

It is difficult to adjust the temperature of the edge area of the to-be-processed substrate W using the first fluid source; however, a second fluid passage 20 is provided in the heat conducting ring 142, while the second liquid source in the second liquid passage 20 can be used to adjust the temperature of the focus ring 13; then the temperature difference between the focus ring 13 and the edge of the to-be-processed substrate W becomes adjustable, such that polymer distribution at the edge of the to-be-processed substrate W can be adjusted, which facilitates forming a trench meeting process requirements in the edge area of the to-be-processed substrate W.

In this embodiment, the distances from the bottoms of respective areas of the second fluid passage to the bottom of the focus ring 13 are equal.

In this embodiment, the flat bottom plate 21 and the heat conducting ring 142 are discretely provided. Because the bottom plat panel 21 is disposed at the bottom of the base 11, while the heat conducting ring 142 and the flat bottom plate 21 are discretely provided, the heat conducting ring 142 has little thermal impact on the base 11, which facilitates lowering the thermal impact of the heat conducting ring 142 on the central area of the to-be-processed substrate W.

in another embodiment, the flat bottom plate 21 and the heat conducting ring 142 are interconnected.

In such an embodiment, the radio frequency electrode assembly further comprises: a thermal insulation layer (not shown) disposed between the flat bottom plate 21 and the heat conducting ring 142, the thermal insulation layer being configured for isolating the bottom plat panel 21 from the heat conducting ring 142. The thermal insulation layer is configured for further reducing heat conduction between the heat conducting ring 142 and the flat bottom plate 21, which facilitates further reduction of the thermal impact of the heat conducting ring 142 on the central area of the to-be-processed substrate.

in another embodiment, the thermal insulation layer is not provided.

In such an embodiment, the plasma processing apparatus comprises: a capacitively coupled plasma processing apparatus (CCP) or an inductively coupled plasma processing apparatus (ICP).

Hereinafter, the heat conducting ring 142 will be explained in detail with reference to FIG. 4.

Figure 4:
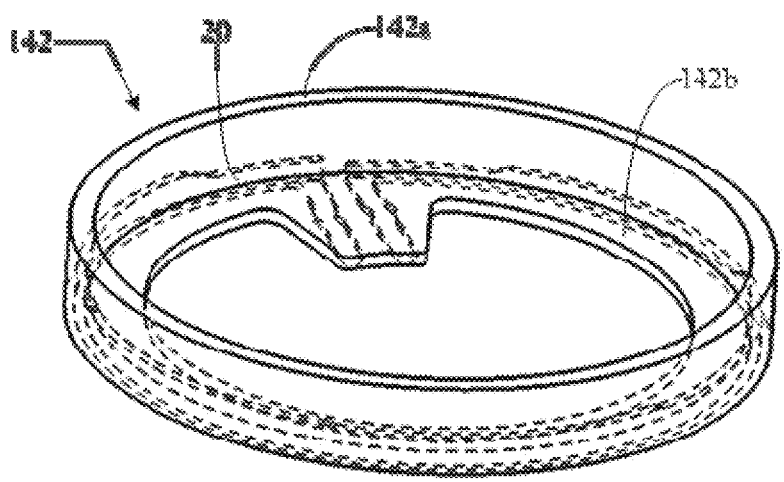
FIG. 4 is a structural schematic diagram of a heat conducting ring according to an embodiment of the present disclosure.

FIG. 4 is a structural schematic diagram of a heat conducting ring according to an embodiment of the present disclosure.

In this embodiment, the heat conducting ring 142 comprises: a first ring part 142a disposed between the base 11 (see FIG. 3) and the dielectric ring 19 (see FIG. 3), and a second ring portion 142b formed by extension of the first ring part 142a till below part of the flat bottom plate 21 (see FIG. 3), so as to facilitate mounting the heat conducting ring 142.

In another embodiment, the heat conducting ring only has the first ring part.

In such an embodiment, the tops of the first till the N-1$^{th}$ areas of the second fluid passage 20 sequentially rise, while the distance from the top of the N$^{th}$ area of the second fluid passage 20 to the bottom of the focus ring is greater than the distance from the top of the N-1$^{th}$ area of the second fluid passage 20 to the bottom of the focus ring; this is because: the first area of the second fluid passage 20 is connected to the fluid inlet, and the N$^{th}$ area of the second fluid passage 20 is connected to the fluid outlet; namely, the N$^{th}$ area of the second fluid passage 20 is proximal to the first area of the second fluid passage 20, while the temperature of the second fluid source in the first area of the second fluid passage 20 is relatively low; as such, the second fluid source of the first area will affect the temperature of the second fluid source in the N$^{th}$ area, preventing the temperature of the second fluid source in the N$^{th}$ area from being too high; in this way, the second fluid source of the N$^{th}$ area has a relatively strong capacity in controlling the temperature of the focus ring 13; therefore, the distance from the top of the N$^{th}$ area in the second fluid passage 20 to the bottom of the focus ring shouldn't be designed too small.

In this embodiment, the second retaining portion 20 runs one lap.

Hereinafter, the pattern of the second fluid passage 20 in FIG. 4 will be described in detail with reference to FIGS. 5 to 7.

Figure 5:
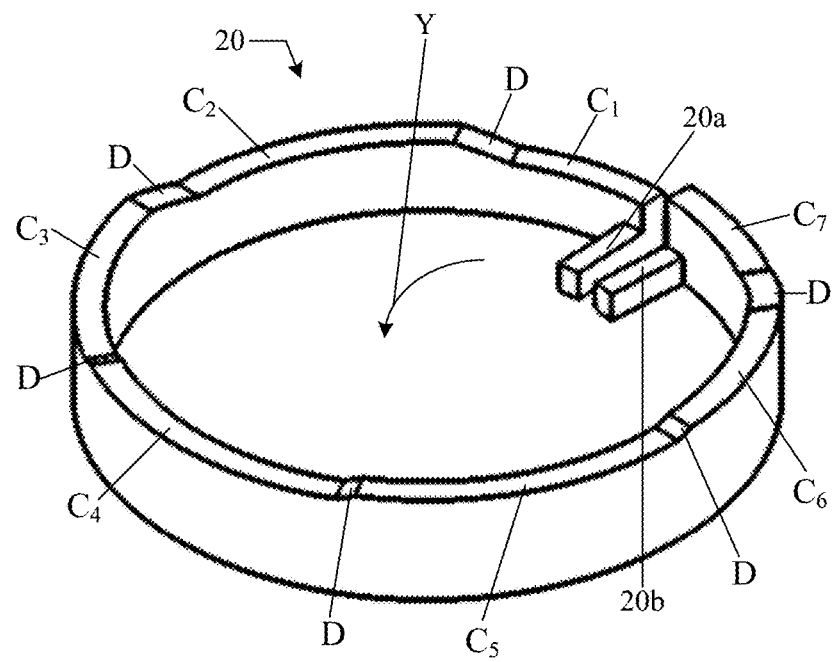
FIG. 5 is a structural schematic diagram of one manner of substantiating the second fluid channel in the heat conducting ring according to an embodiment of the present disclosure.

FIG. 5 is a structural schematic diagram of one manner of substantiating the second fluid channel in the heat conducting ring according to an embodiment of the present disclosure.

The second fluid passage 20 includes N areas along the perimeter Y, where N is a natural number greater than or equal to 1.

In this embodiment, as an example, the second fluid passage 20 includes 7 areas, wherein the tops of the first area $C_1$ till the sixth area $C_6$ of the second fluid passage 20 rise stepwise, the distance from the top of the seventh area $C_7$ of the second fluid passage 20 to the bottom of the focus ring 13 is greater than the distance from the top of the sixth area $C_6$ of the second fluid passage 20 to the bottom of the focus ring. The reason for configuring the second fluid passage 20 with 7 areas is identical to that for configuring the second fluid passage with N areas in the embodiment shown in FIG. 4, which is thus not detailed here.

The first area $C_1$ of the second fluid passage 20 is connected to the fluid inlet 20a, and the N$^{th}$ area of the second fluid passage 20 is connected to the fluid outlet 20b.

It is difficult to adjust the temperature of the edge area of the to-be-processed substrate using the first fluid source;

however, a second fluid passage 20 is provided in the heat conducting ring 142, while the second fluid source in the second fluid passage 20 can be used to adjust the temperature of the focus ring 13; then, the temperature difference between the focus ring 13 and the edge of the to-be-processed substrate W becomes adjustable; in this way, polymer distribution at the edge of the to-be-processed substrate W can be adjusted, facilitating forming a trench meeting process requirements in the edge area of the to-be-processed substrate W.

In this embodiment, two neighboring areas are connected via a connection area D, wherein the connection area D has an included angle with the horizontal plane, while the tops of the first area $C_1$, the second area $C_2$, the third area $C_3$, the fourth area $C_4$, the fifth area $C_5$, the sixth area $C_6$ and the seventh area $C_7$ are parallel to the horizontal plane. Designing the second fluid passage 30 as such facilitates lowering the difficulty of processing the second fluid passage 30.

In another embodiment, the tops of part of the areas of the second fluid passage have an included angle with the horizontal plane.

In such embodiment, the second retaining portion 30 runs one lap.

Figure 6:
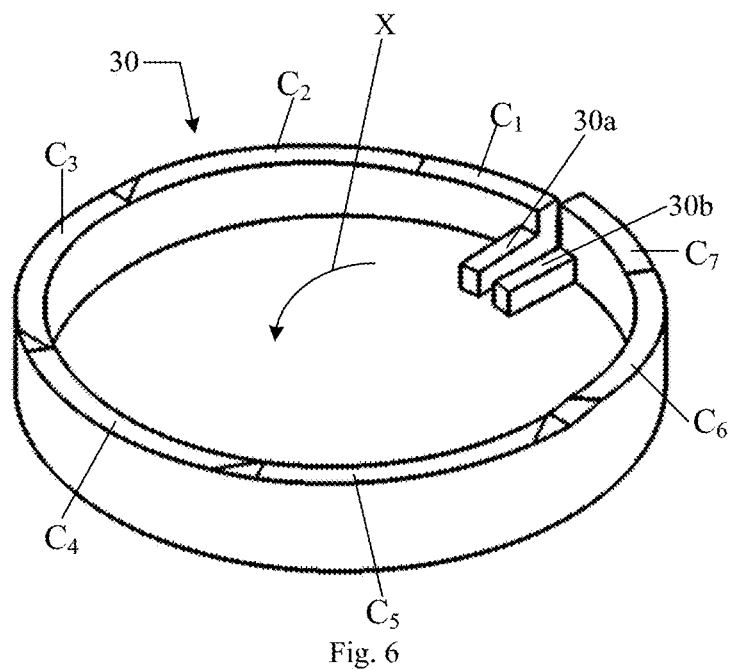
FIG. 6 is a structural schematic diagram of another manner of substantiating the second fluid channel in the heat conducting ring according to an embodiment of the present disclosure.

FIG. 6 is a structural schematic diagram of another manner of substantiating the second fluid channel in the heat conducting ring according to an embodiment of the present disclosure.

This embodiment differs from the one shown in FIG. 5 in that the tops of the first area $C_1$ till the sixth area $C_6$ of the second fluid passage 30 rise in a smooth arc, thereby facilitating flowing of the second fluid source in the second fluid passage 30.

The first area $C_1$ of the second fluid passage 30 is connected to a fluid inlet 30a, and the $N^{th}$ area of the second fluid passage 30 is connected to the fluid outlet 30b.

It is difficult to adjust the temperature of the edge area of the to-be-processed substrate using the first fluid source; however, a second fluid passage 30 is provided in the heat conducting ring 142, while the second fluid source in the second fluid passage 30 can be used to adjust the temperature of the focus ring 13; then, the temperature difference between the focus ring 13 and the edge of the to-be-processed substrate W becomes adjustable; in this way, polymer distribution at the edge of the to-be-processed substrate W can be adjusted, facilitating forming a trench meeting process requirements in the edge area of the to-be-processed substrate W.

In this embodiment, the second retaining portion 30 runs one lap.

Figure 7:
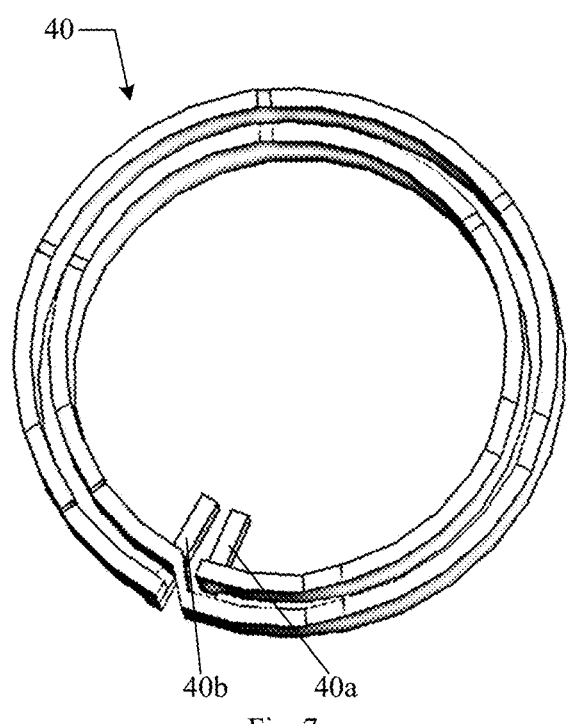
FIG. 7 is a structural schematic diagram of a further manner of substantiating the second fluid channel in the heat conducting ring according to an embodiment of the present disclosure.

FIG. 7 is a structural schematic diagram of a further manner of substantiating the second fluid channel in the heat conducting ring according to an embodiment of the present disclosure.

In this embodiment, the second fluid passage runs two laps, offering a relatively large contact area between the second fluid passage 40 and the focus ring 13, such that the second fluid passage 40 has a strong capacity of controlling the temperature of the focus ring 13.

It is difficult to adjust the temperature of the edge area of the to-be-processed substrate using the first fluid source; however, a second fluid passage 40 is provided in the heat conducting ring 142, while the second fluid source in the second fluid passage 40 can be used to adjust the temperature of the focus ring 13; then, the temperature difference between the focus ring 13 and the edge of the to-be-processed substrate W becomes adjustable; in this way, polymer distribution at the edge of the to-be-processed substrate W can be adjusted, facilitating forming a trench meeting process requirements in the edge area of the to-be-processed substrate W.

In another embodiment, the second fluid passage runs more than two laps.

Despite of the above disclosure, the present disclosure is not limited thereto. Without departing from the spirit and scope of the present disclosure, any technical person may make various alterations and modifications; therefore, the protection scope of the present disclosure should refer to the scope limited in the appending claims.

We claim:

1. A radio frequency electrode assembly for a plasma processing apparatus, comprising:
   a base in which a first fluid passage is provided, the first fluid passage being configured for connecting to a first fluid source;
   an electrostatic chuck disposed on the base, the electrostatic chuck having a first supporting face for supporting a substrate;
   a focus ring disposed peripheral to the electrostatic chuck; and
   a heat conducting ring disposed around the base, the heat conducting ring being disposed below the focus ring, the heat conducting ring enclosing at least part of the base, a second fluid passage being provided in the heat conducting ring, the second fluid passage having a fluid inlet and a fluid outlet connected to a second fluid source, the second fluid entering the second fluid passage via the fluid inlet and flowing out of the second fluid passage from the fluid outlet, and the fluid inlet and fluid outlet being in same horizontal plane, heat conduction being enabled between the heat conducting ring and the focus ring;
   wherein the distances from top of the second fluid passage to bottom of focus ring vary along perimeter of the second fluid passage, such that the top of the second fluid passage rises from the fluid inlet towards the fluid outlet.

2. The radio frequency electrode assembly according to claim 1, wherein a gap is provided between the heat conducting ring and the base.

3. The radio frequency electrode assembly according to claim 2, wherein the gap has a width greater than or equal to 0.5 mm.

4. The radio frequency electrode assembly according to claim 2, wherein a thermal insulation material layer is filled in the gap, the material of the thermal insulation material layer being selected from Teflon, polyetherimide, polyether-ether-ketone, or polyimide.

5. The radio frequency electrode assembly according to claims 1, further comprising: a coupling ring disposed between the focus ring and the heat conducting ring; a bottom grounding ring enclosing the heat conducting ring; a dielectric ring disposed between the bottom grounding ring and the heat conducting ring, the dielectric ring surrounding the heat conducting ring.

6. The radio frequency electrode assembly according to claim 5, wherein the material of the coupling ring is selected from aluminum oxide and quartz.

7. The radio frequency electrode assembly according to claim 1, further comprising: a flat bottom plate disposed below the base.

8. The radio frequency electrode assembly according to claim 7, wherein the flat bottom plate and the heat conducting ring are interconnected; or, the flat bottom plate and the heat conducting ring are discretely provided.

9. The radio frequency electrode assembly according to claim 1, wherein the second fluid passage includes N areas sequentially along the perimeter of the focus ring, where N is a natural number greater than or equal to 1; a first area of the second fluid passage being connected to the fluid inlet, the $N^{th}$ area of the second fluid passage being connected to the fluid outlet, the second fluid source entering the second fluid passage via the fluid inlet and flowing out of the second fluid passage from the fluid outlet.

10. The radio frequency electrode assembly according to claim 9, wherein N is larger than 1 and wherein the distances from the tops of the second fluid passage to the bottom of focus ring vary in the N areas of the second fluid passage.

11. The radio frequency electrode assembly according to claim 9, wherein N is larger than 1 and wherein in the direction vertical to the first supporting face, the distances from the tops of the first till the N-1$^{th}$ areas of the second fluid passage to the bottom of the focus ring sequentially decrease; and the distance from the top of the $N^{th}$ area of the second fluid passage to the bottom of the focus ring is greater than the distance from the top of the N-1$^{th}$ area of the second fluid passage to the bottom of the focus ring.

12. The radio frequency electrode assembly according to claim 9, wherein N is larger than 1 and wherein the cross section of the first till the $N^{th}$ areas of the second fluid passage sequentially increase; the distances from bottoms of the first till the $N^{th}$ areas of the second fluid passage to the bottom of the focus ring are identical; and the distances from the tops of the first till the Nth areas of the second fluid passage to the bottom of the focus ring sequentially decrease.

13. The radio frequency electrode assembly according to claim 9, wherein N is larger than 1 and wherein the cross section of the first till the N-1$^{th}$ areas of the second fluid passage sequentially increase, the cross section of the $N^{th}$ area of the second fluid passage being smaller than the size of the N-1$^{th}$ area of the second fluid passage; the distances from the bottoms of the first till the $N^{th}$ areas of the second fluid passage to the bottom of the focus ring are equal; and the distances from the tops of the first till the N-1$^{th}$ areas of the second fluid passage sequentially decrease, wherein the distance from the top of the $N^{th}$ area of the second fluid passage is greater than the distance from the top of the N-1$^{th}$ area of the second fluid passage to the bottom of the focus ring.

14. A plasma processing apparatus, comprising:
a vacuum chamber;
a base disposed downstream of the vacuum chamber, a first fluid passage being provided inside the base, the first fluid passage being configured for connecting to a first fluid source;
an electrostatic chuck disposed on the base, the electrostatic chuck having a first supporting face for support a substrate;
a focus ring disposed peripheral to the electrostatic chuck;
a heat conducting ring disposed around the base, the heat conducting ring being disposed below the focus ring, the heat conducting ring enclosing at least part of the base, a second fluid passage being provided in the heat conducting ring, the second fluid passage having a fluid inlet and a fluid outlet connected to a second fluid source, the second fluid entering the second fluid passage via the fluid inlet and flowing out of the second fluid passage from the fluid outlet, and the fluid inlet and fluid outlet being in same horizontal plane, heat conduction being enabled between the heat conducting ring and the focus ring; and
gas intake means disposed at the top of the vacuum chamber, the gas intake means being configured for supplying a reactant gas into the vacuum chamber;
wherein the distances from top of the second fluid passage to bottom of focus ring vary along perimeter of the second fluid passage, such that the top of the second fluid passage rises from the fluid inlet towards the fluid outlet.

15. The plasma processing apparatus according to claim 14, wherein the second fluid passage includes N areas sequentially along the perimeter of the focus ring, N being a natural number greater than or equal to 1; a first area of the second fluid passage being connected to the fluid inlet, the $N^{th}$ area of the second fluid passage being connected to the fluid outlet, the second fluid source entering the second fluid passage via the fluid inlet and flowing out of the second fluid passage from the fluid outlet; the distances from the tops of the second fluid passage to the bottom of focus ring vary in the N areas of the second fluid passage.

16. The plasma processing apparatus according to claim 15, wherein the distances from the tops of the first till the N-1$^{th}$ areas of the second fluid passage to the bottom of the focus ring sequentially decrease; and the distance from the top of the $N^{th}$ area of the second fluid passage to the bottom of the focus ring is greater than the distance from the top of the N-1$^{th}$ area of the second fluid passage to the bottom of the focus ring.

17. The plasma processing apparatus according to claim 15, wherein the cross section of the first till the $N^{th}$ areas of the second fluid passage sequentially increase.

18. The plasma processing apparatus according to claim 14, wherein the plasma processing apparatus further comprises: a flat bottom plate disposed below the base, the flat bottom plate and the heat conducting ring being interconnected.

* * * * *